(12) United States Patent
Hwang

(10) Patent No.: US 7,918,679 B2
(45) Date of Patent: Apr. 5, 2011

(54) TEST AND BURN-IN SOCKET FOR INTEGRATED CIRCUITS (ICS)

(75) Inventor: Dong Weon Hwang, Seoul (KR)

(73) Assignee: Dong Weon Hwang, Seoul (KR)

( * ) Notice: Subject to any disclaimer, the term of this patent is extended or adjusted under 35 U.S.C. 154(b) by 0 days.

(21) Appl. No.: 12/899,875

(22) Filed: Oct. 7, 2010

(65) Prior Publication Data

US 2011/0028019 A1  Feb. 3, 2011

Related U.S. Application Data

(62) Division of application No. 11/720,612, filed as application No. PCT/KR2005/004378 on Dec. 19, 2005, now Pat. No. 7,828,575.

(30) Foreign Application Priority Data

Dec. 20, 2004 (KR) .................. 10-2004-0108545

(51) Int. Cl.
*H01R 13/62* (2006.01)
(52) U.S. Cl. .......................... 439/331; 439/73
(58) Field of Classification Search ............... 439/70, 439/71, 73, 331
See application file for complete search history.

(56) References Cited

U.S. PATENT DOCUMENTS

| 5,320,559 | A | * | 6/1994 | Uratsuji et al. | 439/482 |
| 5,700,155 | A | * | 12/1997 | Matsuoka | 439/266 |
| 7,828,575 | B2 | * | 11/2010 | Hwang | 439/331 |
| 2008/0207036 | A1 | * | 8/2008 | Hwang | 439/331 |
| 2009/0275220 | A1 | * | 11/2009 | Hwang | 439/73 |

FOREIGN PATENT DOCUMENTS

| JP | 08-50975 | 2/1996 |
| KR | 10-2001-15424 | 2/2001 |
| KR | 10-2003-22736 | 3/2003 |

* cited by examiner

*Primary Examiner* — James Harvey
(74) *Attorney, Agent, or Firm* — Adam K. Sacharoff; Much Shelist

(57) ABSTRACT

Disclosed herein is a test and burn-in socket for integrated circuits. The socket includes a socket body (37). A lead guide (36) is provided under the socket body. A slide (35) is mounted to the socket body to move horizontally. A plurality of slide springs (39) is elastically supported between the slide and the socket body, thus allowing the slide to smoothly restore an original position thereof. A contact guide (31) is provided above the slide to guide positions of upper contact terminals of contacts. An IC guide (30) is provided above the contact guide to guide a position of an IC. A cover (21) is provided to move vertically from the socket body (37). A latch (29) presses the IC. The socket also includes the contacts (33).

3 Claims, 14 Drawing Sheets

[Fig. 1]
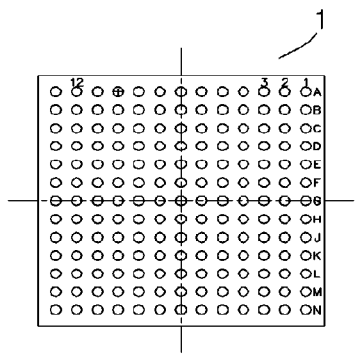
[Fig. 2]
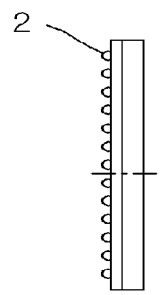
[Fig. 3]
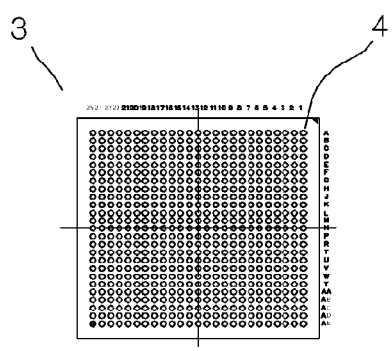
[Fig. 4]
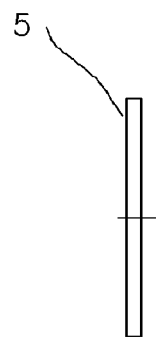

[Fig. 5]
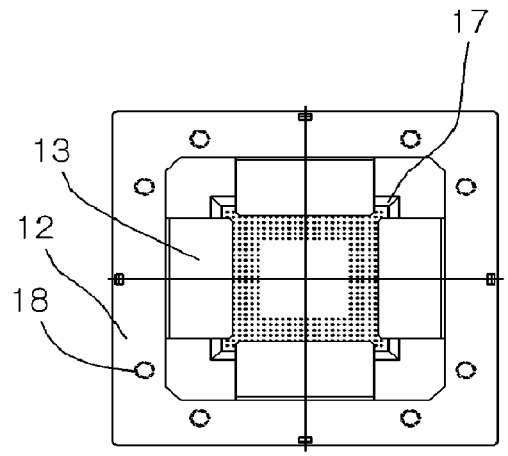
[Fig. 6]
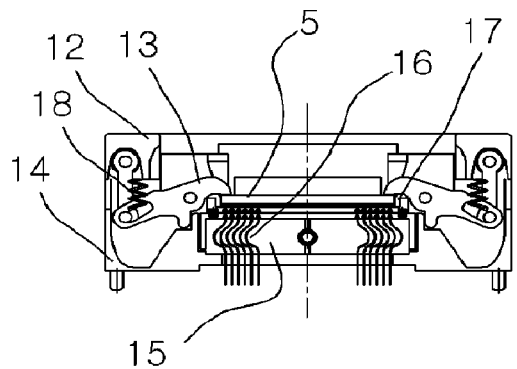
[Fig. 7]
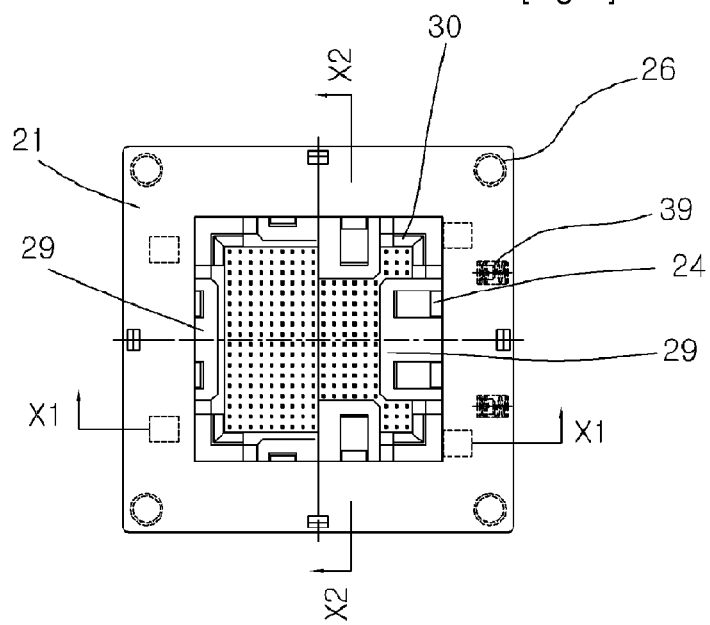

[Fig. 8]
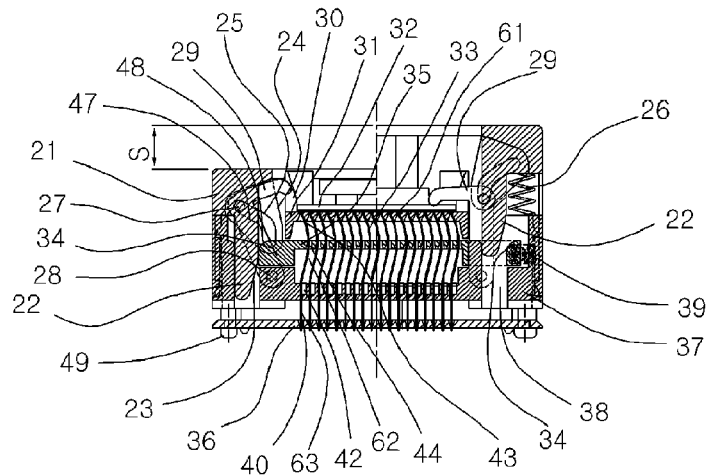
[Fig. 9]
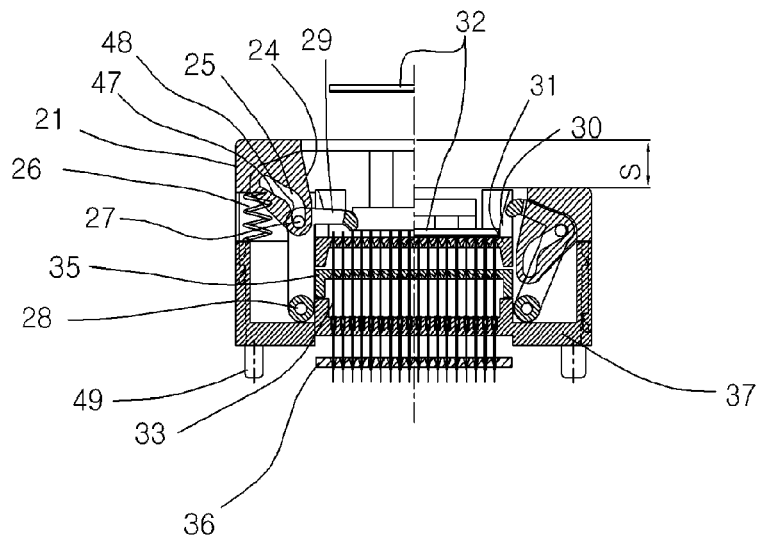
[Fig. 10]
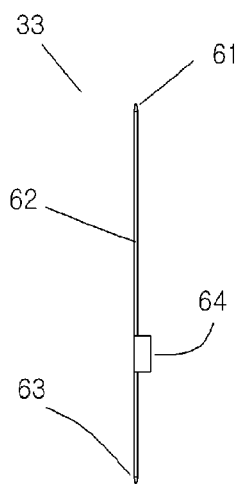

[Fig. 11]
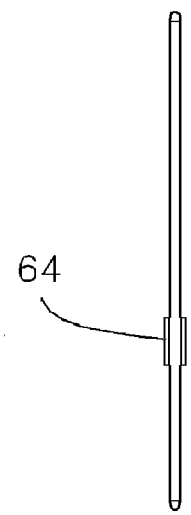
[Fig. 12]
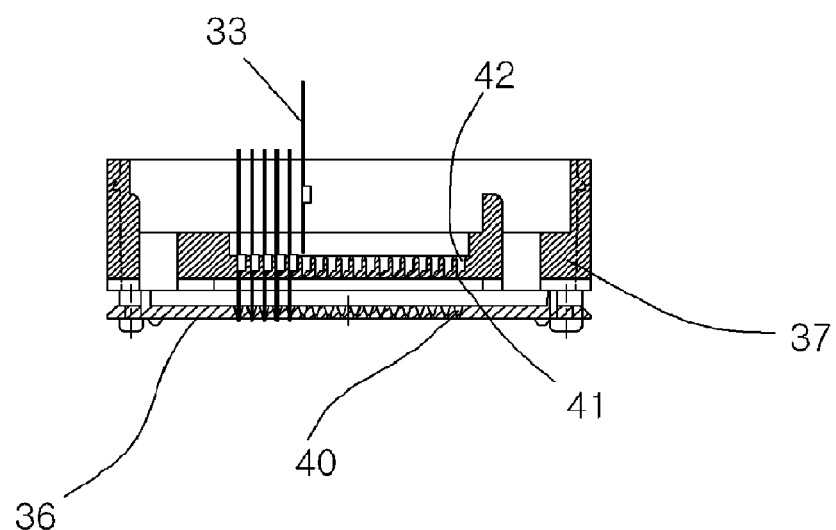
[Fig. 13]
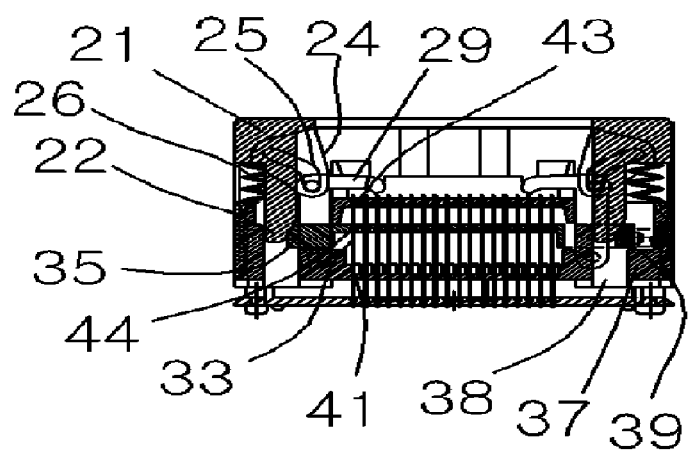

[Fig. 14]
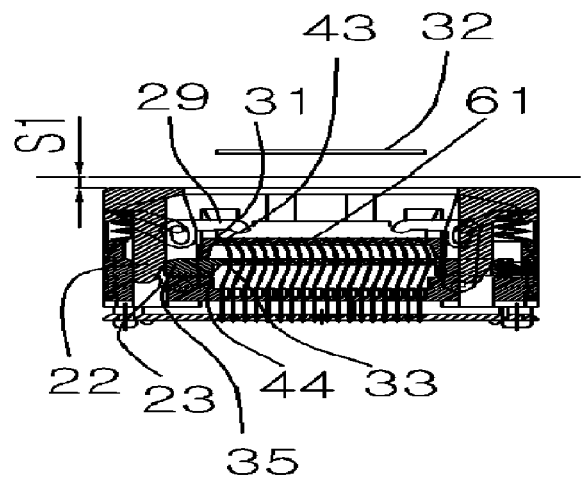
[Fig. 15]
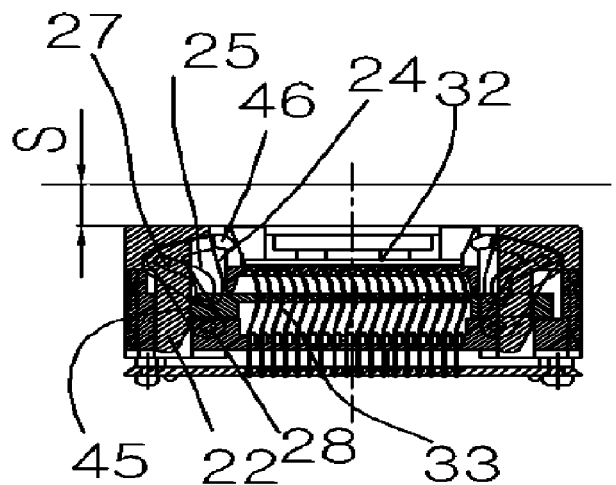
[Fig. 16]
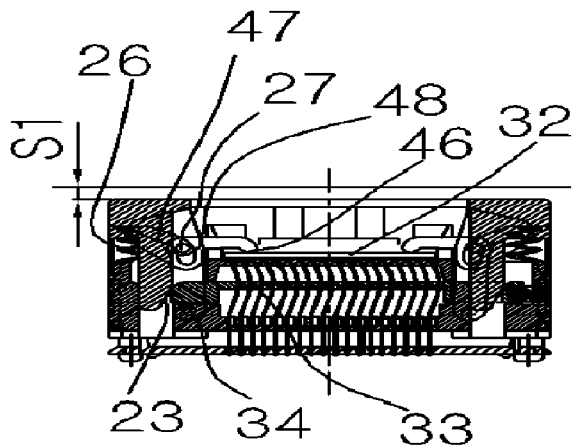

[Fig. 17]
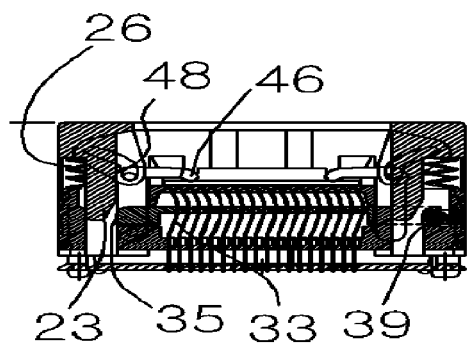
[Fig. 18]
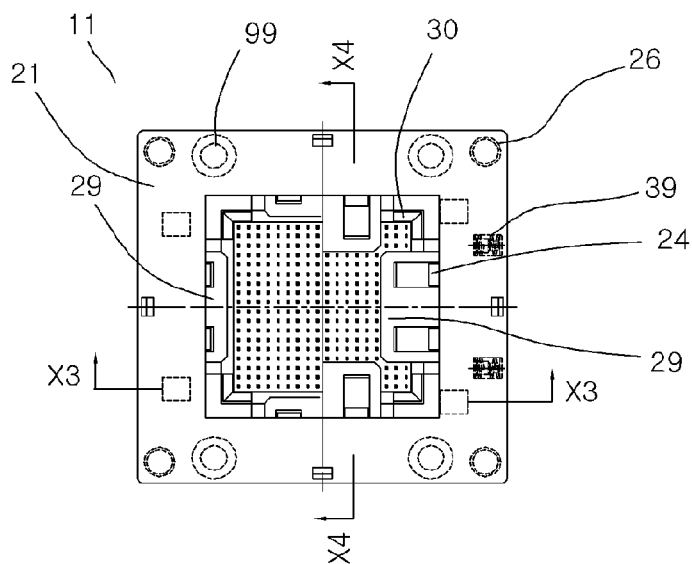
[Fig. 19]
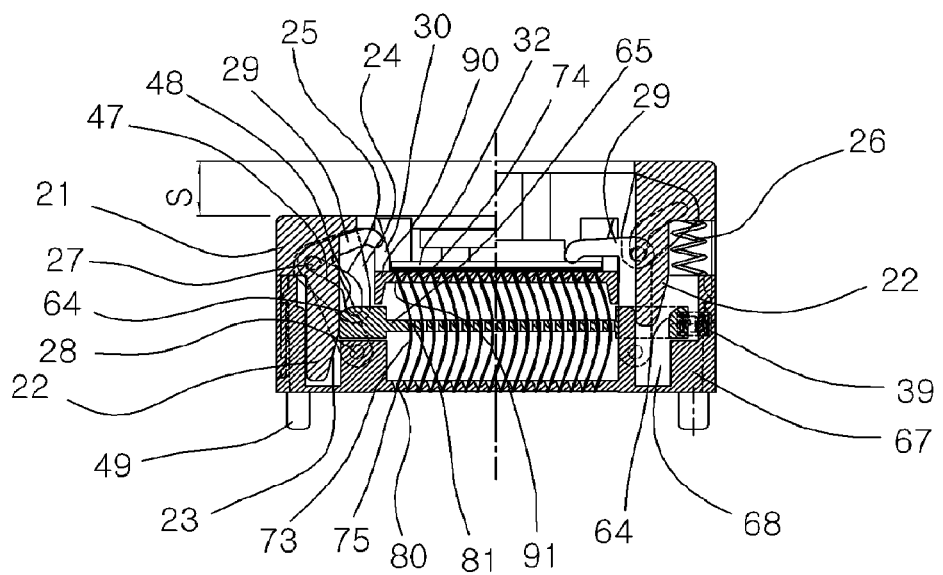

[Fig. 20]
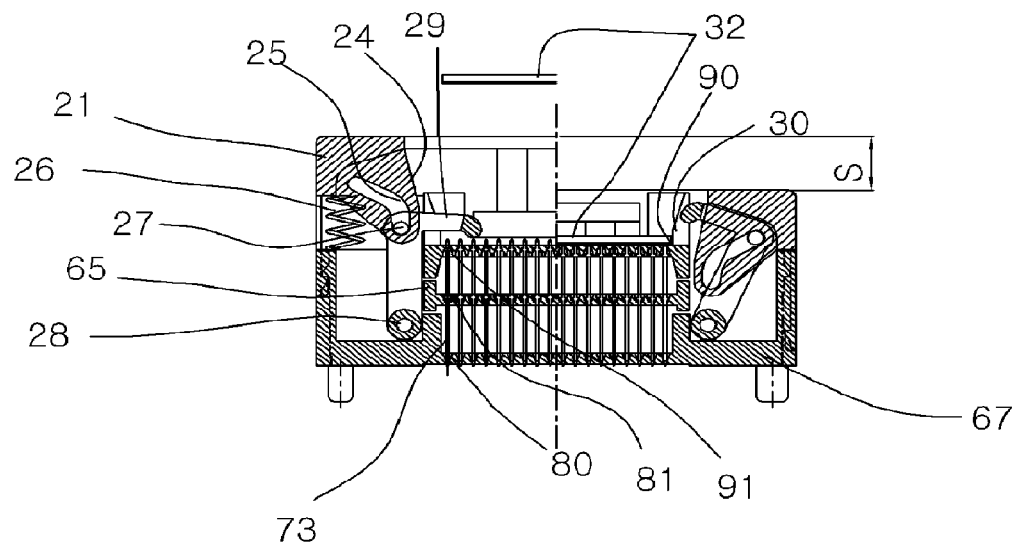
[Fig. 21]
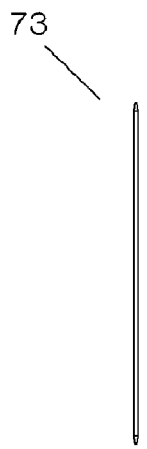
[Fig. 22]
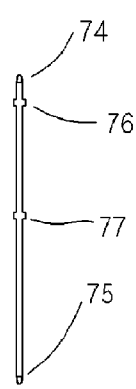

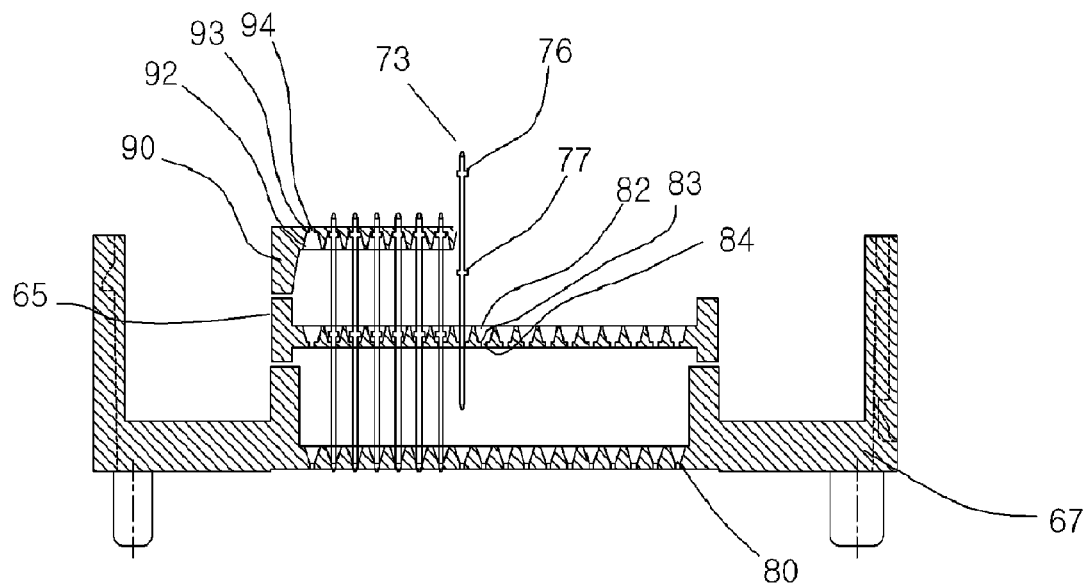
[Fig. 23]
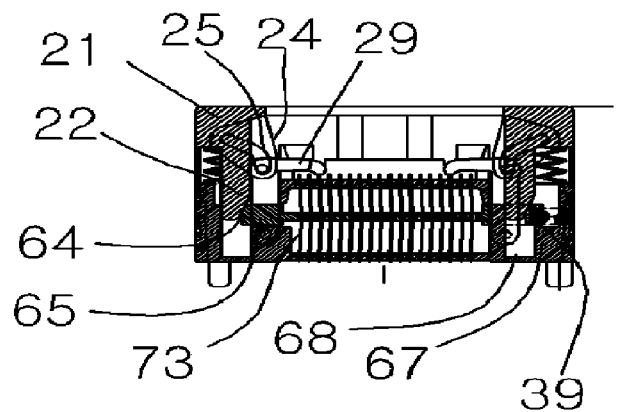
[Fig. 24]
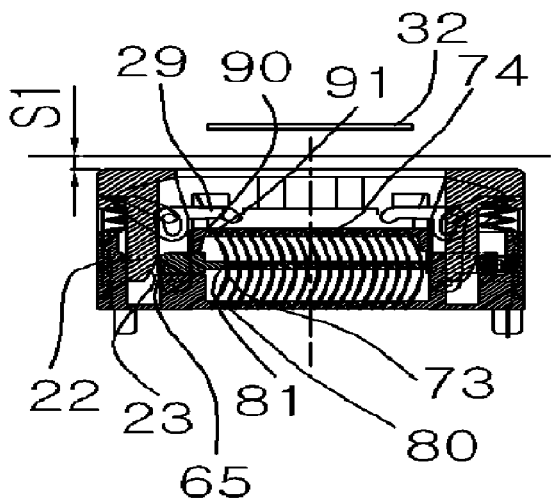
[Fig. 25]

[Fig. 26]
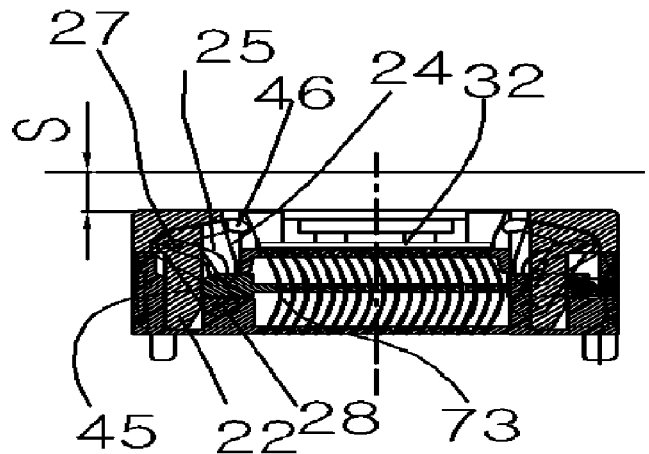
[Fig. 27]
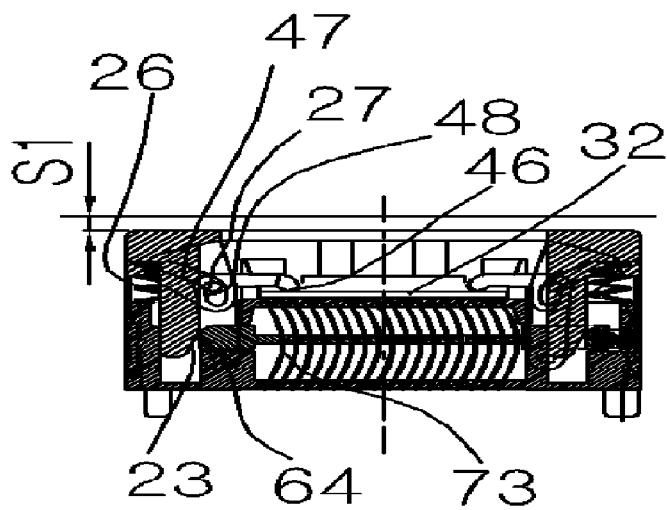
[Fig. 28]
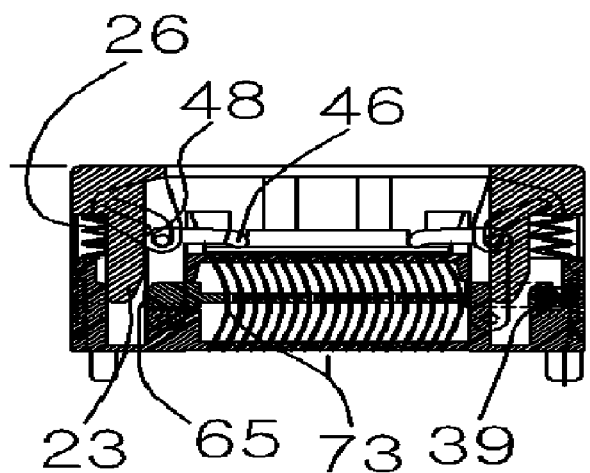

[Fig. 29]
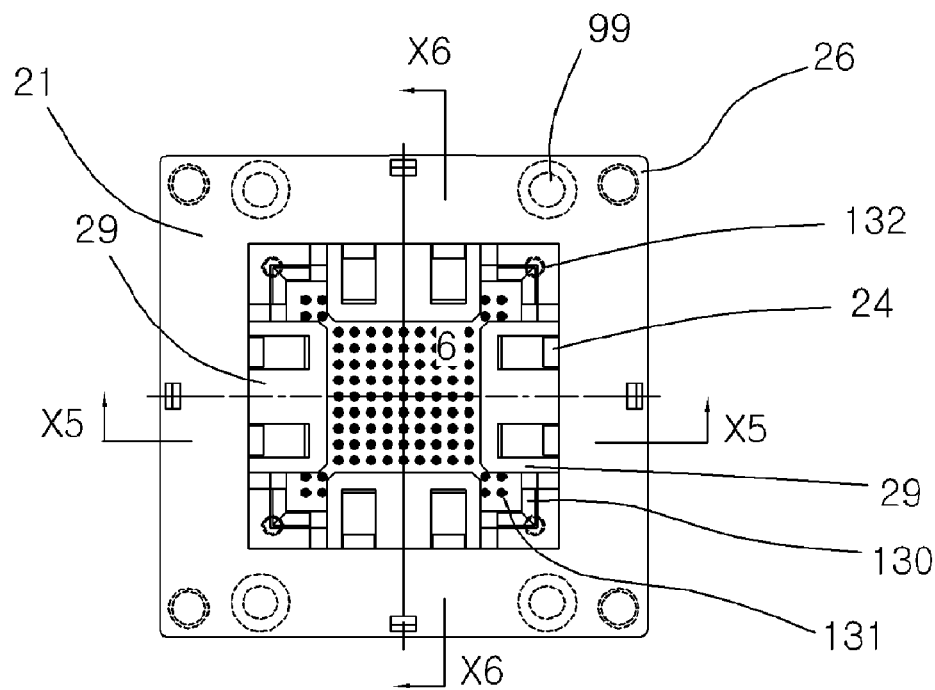
[Fig. 30]
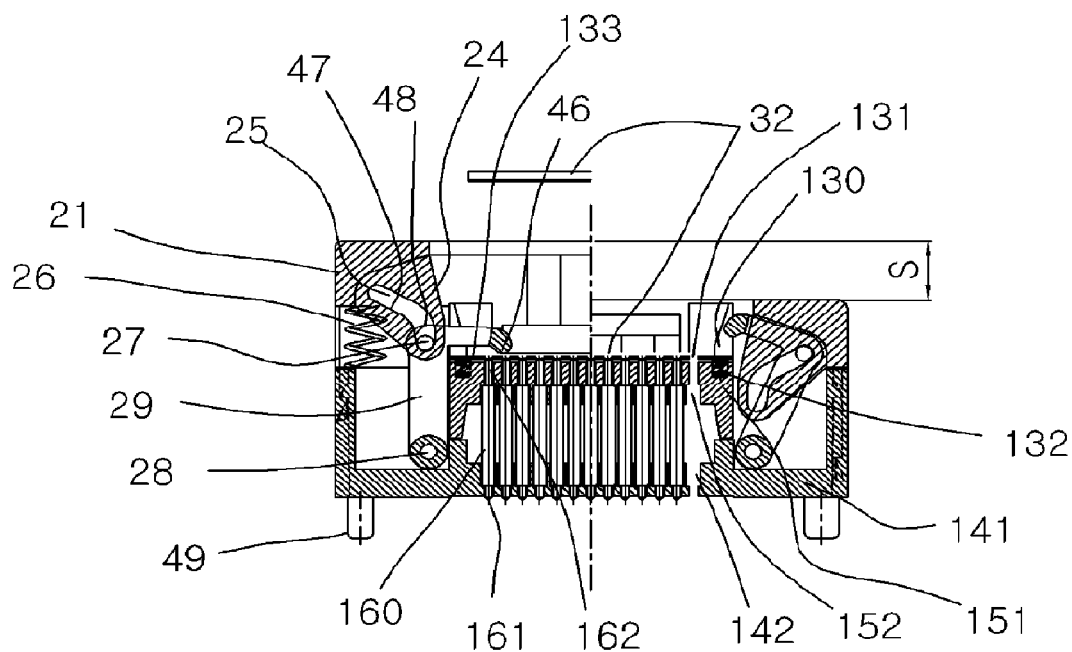

[Fig. 31]
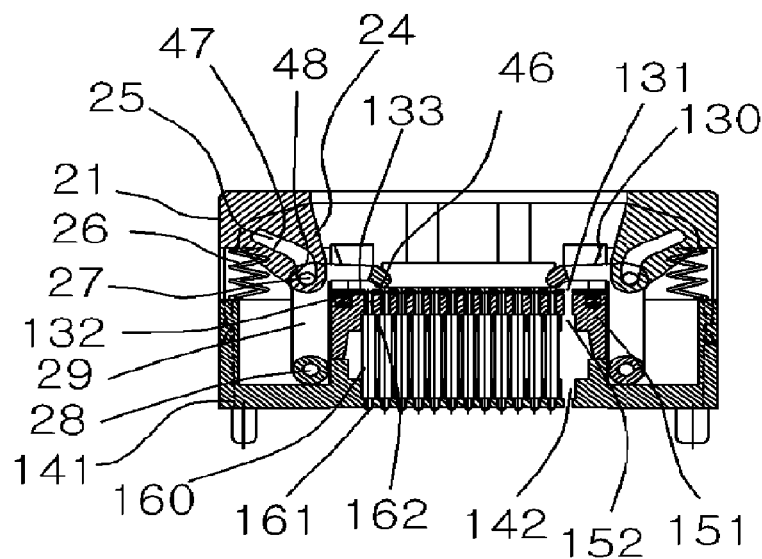
[Fig. 32]
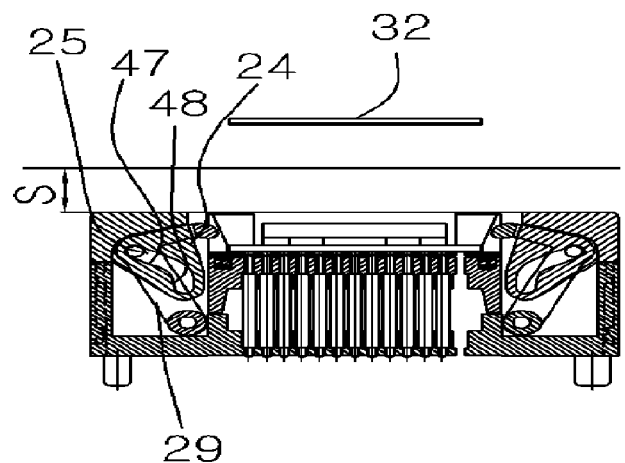
[Fig. 33]
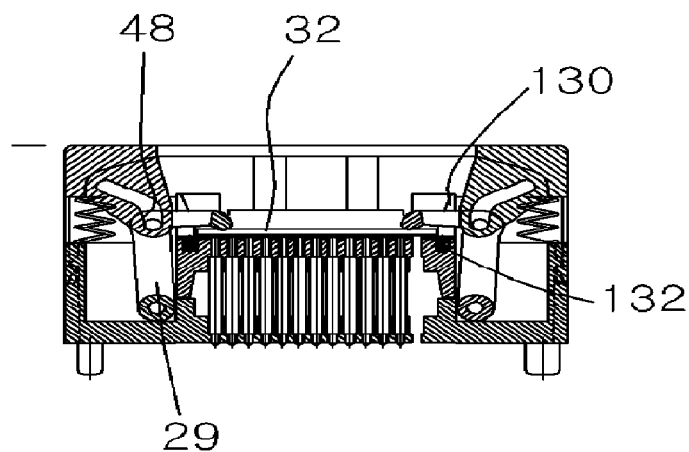

[Fig. 34]
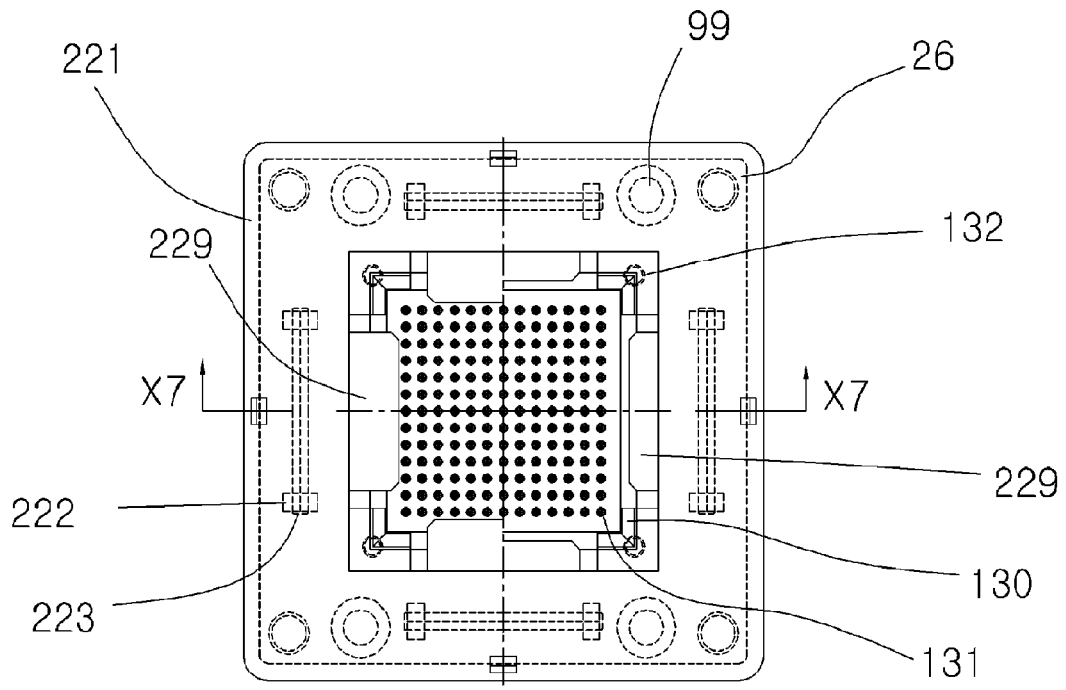
[Fig. 35]
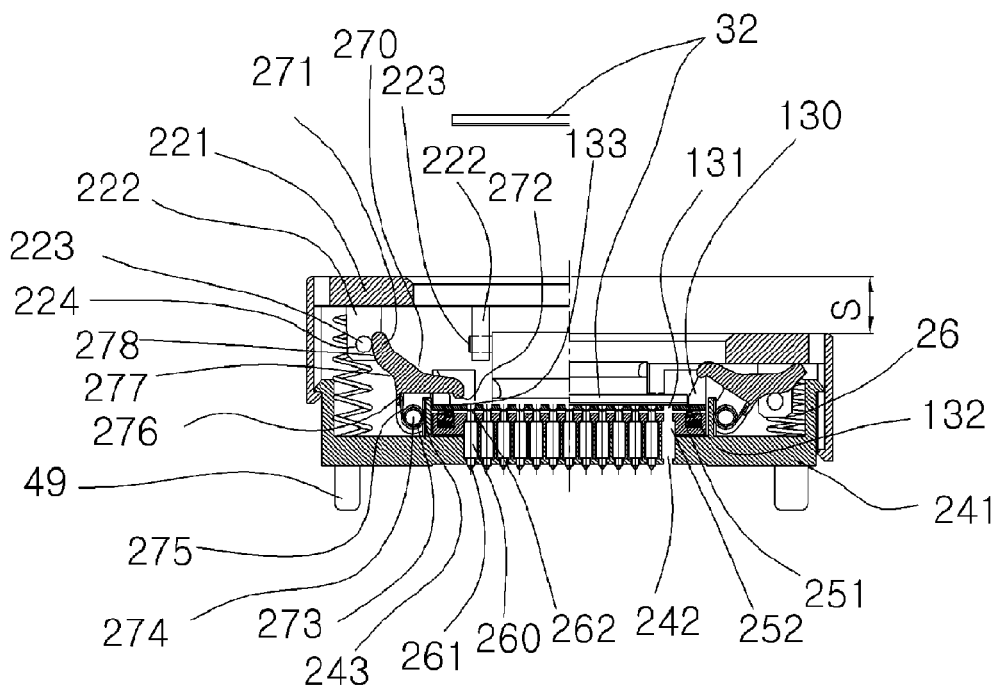

[Fig. 36]
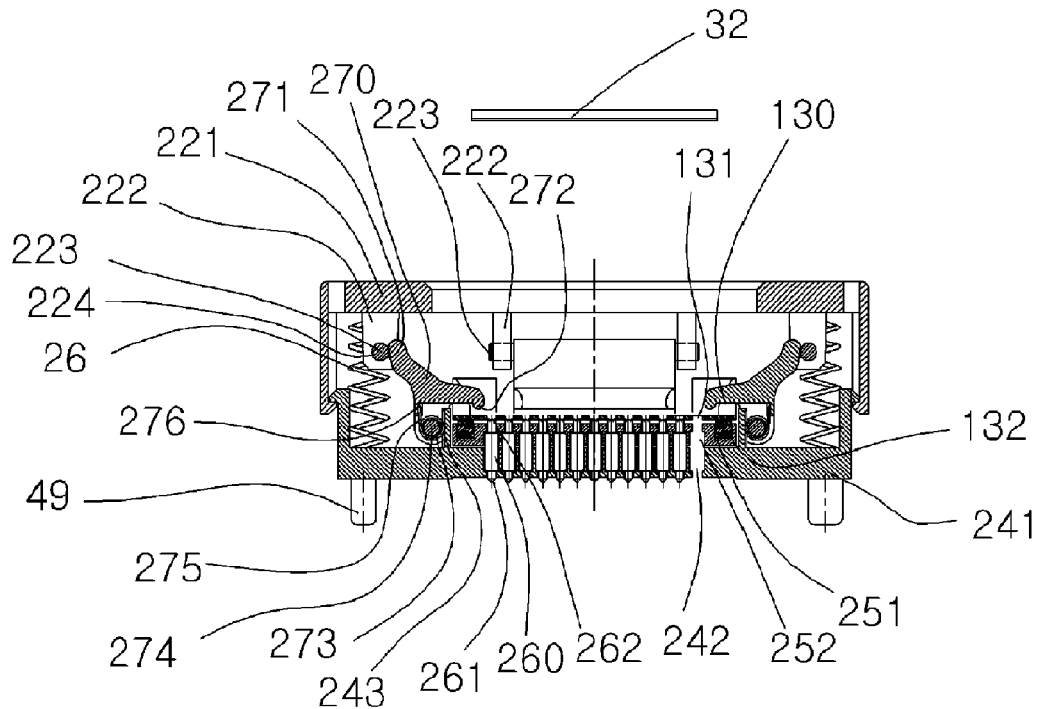
[Fig. 37]
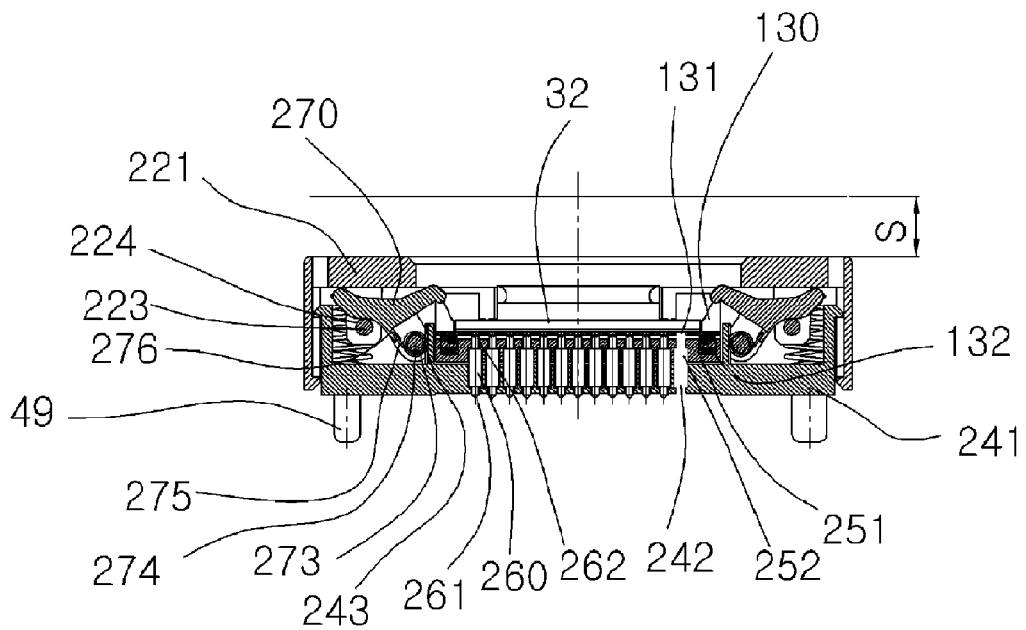

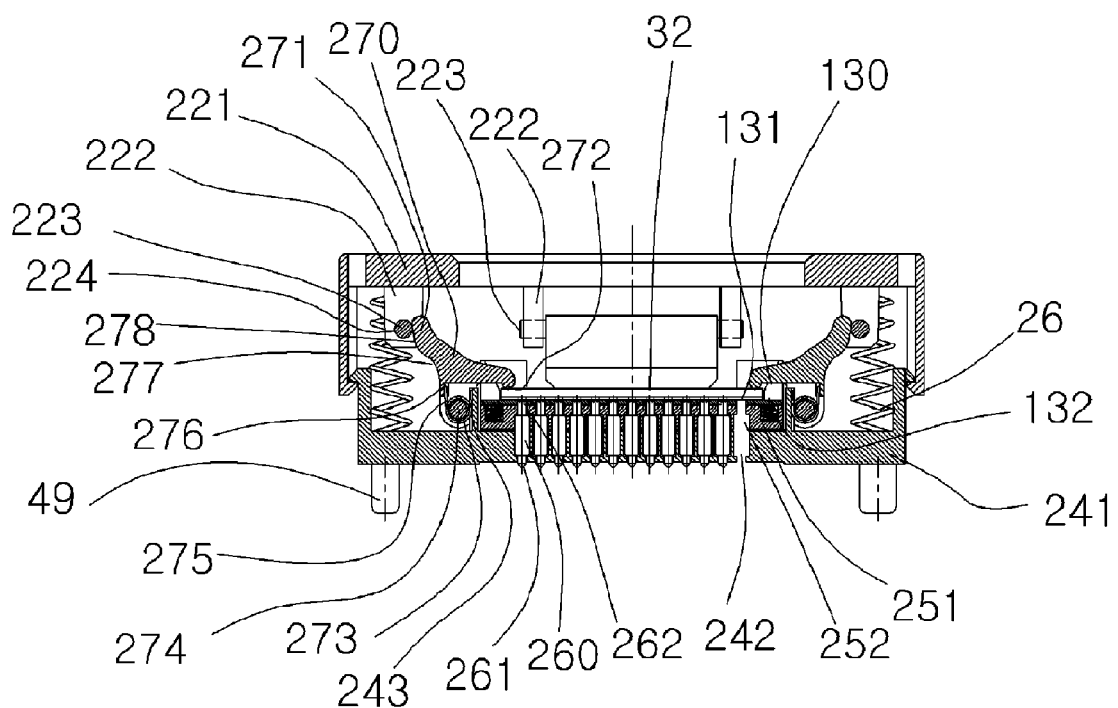
[Fig. 38]

TEST AND BURN-IN SOCKET FOR INTEGRATED CIRCUITS (ICS)

CROSS REFERENCE TO RELATED APPLICATIONS

This application is a division of U.S. application Ser. No. 11/720,612 filed Jun. 1, 2007 which is a 371 of international application PCT/KR2005/004378 filed Dec. 19, 2005 which claims priority to Korean Patent Application No 10-2004-0108545 filed Dec. 20, 2004.

TECHNICAL FIELD

The present invention relates to a test and burn-in socket for integrated circuits and, more particularly, to a socket for an LGA (Land Grid Array).

BACKGROUND ART

Generally, a socket for ICs (Integrated Circuits) is loaded in a test board or a burn-in board. The socket is connected to measuring devices for measuring the properties of a burn-in chamber or peripheral devices and an IC, thus being used in a system for testing a series of ICs. In this case, the burn-in chamber is used to input and output power and an electric signal, which are required to drive the IC, through an I/O terminal (input and output terminal) formed on the board (test board, burn-in board).

Among the ICs that have been widely used, a BGA (Ball Grid Array) type of IC is shaped as shown in FIGS. 1 and 2. Terminals of the IC, that is, balls, are arranged throughout the bottom of the IC, thus dramatically reducing the size and thickness of the IC.

Generally, the pitch between the balls of the BGA-type IC is 0.5 mm, 0.75 mm, 0.8 mm, 1.0 mm, 1.27 mm, 1.6 mm, etc. Each ball has a diameter from 0.3 mm to 0.9 mm. The height from the lower surface of the BGA-type IC to each ball is set to 0.2 mm to 0.6 mm. As the pitch between the balls is reduced, the diameter and height of the ball is reduced.

Meanwhile, as shown in FIGS. 3 and 4, an LGA-type IC is an IC which removes balls from the BGA-type IC. A socket for loading the LGA-type IC is provided with a plurality of contacts having a predetermined elastic forte in a vertical direction. The lower terminal of each contact is connected to a PCB (Printed Circuit Board).

In this case, the upper terminal of each contact is formed to contact the land of the LGA-type IC which is loaded in the socket. Thus, a device for pressing down the LGA-type IC so as to provide stable electrical contact must be provided on the socket.

When a physical force acting on the LGA-type IC by the pressing device is divided by the number of contacts, a physical force applied to one contact is calculated. The physical force applied to the contacts is about 15 gf per contact. Assuming that the LGA-type IC has 1000 lands, strong physical force of about 15 Kgf is required. Thus, the socket in which the LGA-type IC is loaded must be provided with a latch so as to efficiently apply strong physical force to the IC. The socket must be also provided with reliable contacts which may stably transmit additional power or signals.

A conventional representative socket for loading an LGA-type IC is provided with contacts 16 which are bent in an arc shape, as shown in FIGS. 5 and 6. Further, the socket is provided with a lever 13 which presses the LGA-type IC with a strong physical force. The contacts 16 are elastically deformed downwards by the lever 13.

As described above, the conventional socket for the LGA-type IC is problematic in that the contacts are arranged and assembled using additional parts for assembling the contacts having the arc-shaped bent parts, so that a greater number of components is required, assembly is difficult, and the lever for applying strong physical force and the socket for operating the lever have complicated constructions. The conventional socket has another problem in that the cost thereof is increased and the quality thereof is deteriorated due to the complicated construction of the socket.

DISCLOSURE

Technical Problem

Accordingly, the present invention has been made keeping in mind the above problems occurring in the prior art, and an object of the present invention is to provide a test and burn-in socket for integrated circuits (ICs), in which contacts provided on the socket have a straight-line shape so as to increase the productivity and uniformity of components and afford easy treatment of the components, a plurality of contacts held in the socket is deformed to an arc shape by pressing a cover of the socket, and thereafter an IC is loaded in the socket, the IC is pressed downwards using a plurality of latches, and a physical force acting on the IC is removed when a cover returns to its original position, so that upper terminals of the contacts have a constant physical force through elastic restoring force of the contacts which are deformed in the arc shape and contact lands of the IC.

Another object of the present invention is to provide a test and burn-in socket for ICs, in which a lever is constructed to be locked, when an IC is pressed and force is increased, so that latches are moved in an open direction, that is, moved upwards so that upper terminals of contacts are restored to their original shapes, namely, straight-line shapes, thus efficiently pressing the IC.

Technical Solution

In order to accomplish the objects, the present invention provides a test and burn-in socket for integrated circuits (ICs), including a socket body 37 having a plurality of contact support holes 42 to receive and support a plurality of contacts 33 therein, and a plurality of positioning pins 49 to secure the socket body to a predetermined position on a printed circuit board (PCB); a lead guide 36 provided under the socket body 37, and having a plurality of lead guide holes 40; a slide 35 mounted to the socket body 37 to move horizontally within a predetermined range, and having a plurality of contact parts 34 contacting slide cams 22 to allow smooth sliding motion of the slide, and a plurality of contact through holes 44 through which upper contact terminals 61 of the contacts 33 pass; a plurality of slide springs 39 elastically supported between the slide 35 and the socket body 37, thus allowing the slide 35 to smoothly restore an original position thereof; a contact guide 31 provided above the slide 35, having a plurality of terminal through holes 43 used to arrange the upper contact terminals 61 of the contacts at predetermined positions, and guiding positions of the upper contact terminals 61 of the contacts; an IC guide 30 provided above the contact guide 31 to guide a position of an IC; a cover 21 moving vertically from the socket body 37 to a maximum moving distance S, and including a plurality of cover springs 26 elastically supported between the cover and the socket body 37, a plurality of slide cams 22, and a plurality of slot plates 24 each having a latch cam slot 25; a latch 29 pressing the IC, and including a fixed hole 28 to fix the latch to the socket body 37 using a latch moving shaft, and a movable hole 27 to move along an inclined surface of the latch cam slot 25; and the plurality of contacts 33 each having an upper contact terminal 61, an elastic part 62, and a lower contact terminal 63 that are provided in a straight-line shape, and an U-shaped body fitting part 64.

Preferably, when the cover 21 moves downwards, the slide 35 is moved rightwards by inclined surfaces 23 of the slide cams, and the elastic parts 62 of the contacts 33 fitted into the contact through holes 44 are elastically deformed in an arc shape.

Further, the latch cam slot 25 includes a gentle slope 47 curved in an arc shape and having a gentle curvature, and a steep slope 48 having a steeper curvature, in comparison with the gentle slope 47.

The present invention provides a test and burn-in socket for integrated circuits (ICs), including a socket body 67 having a plurality of bolt insert holes 99 used to fasten the socket body to a PCB using bolts, a plurality of holes 80 through which a plurality of lower contact terminals 75 of contacts pass, and a plurality of positioning pins 49 to secure the socket body to a predetermined position of a printed circuit board (PCB); a slide 65 mounted to the socket body 67 to move horizontally within a predetermined range, and including a plurality of lower stop holes 81 through which the lower contact terminals 75 of the contacts pass, and a plurality of cam contact parts 64; a plurality of slide springs 39 elastically supported between the slide 65 and the socket body 67, thus allowing the slide 65 to smoothly restore an original position thereof; a contact guide 90 having a plurality of upper stop holes 91 through which upper contact terminals of the contacts pass, and guiding positions of the upper contact terminals 74 of the contacts; a cover 21 elastically biased towards the socket body 67 by a cover spring 26, moving vertically from the socket body 67 to a maximum moving distance, and including a plurality of slide cams 22, and a plurality of slot plates 24 each having a latch cam slot 25; a latch 29 pressing an IC, and including a fixed hole 28 to fix the latch to the socket body 67 using a latch moving shaft, and a movable hole 27 to move along an inclined surface of the latch cam slot 25; and a plurality of contacts 73 each including an upper contact terminal 74, a lower contact terminal 75, an upper stop protrusion 76, and a lower stop protrusion 77 that are provided in a straight-line shape.

Preferably, when the cover 21 moves downwards, the slide 65 is moved rightwards by inclined surfaces 23 of the slide cams 22, and the contacts fitted into the lower stop holes 81 of the slide 65 are elastically deformed in an arc shape.

Further, the latch cam slot 25 includes a gentle slope 47 curved in an arc shape and having a gentle curvature, and a steep slope 48 having a steeper curvature than the gentle slope 47.

Further, the present invention provides a test and burn-in socket for integrated circuits (ICs), including a socket body 141 having a plurality of holes 142 through which a plurality of lower terminals 161 of pogo contacts pass, the holes formed to prevent contact bodies 160 from being dislodged from predetermined positions, a plurality of positioning pins 49 to secure the socket body to a predetermined position on a printed circuit board (PCB), and a plurality of bolt insert holes 99 used to fasten the socket body to the PCB using bolts; a contact guide 151 having a plurality of holes through which upper terminals 162 of the pogo contacts pass, the holes formed to prevent the contact bodies 160 from being dislodged from predetermined positions; an IC guide 130 provided above the contact guide 151 to guide an IC, and including a plurality of moving holes 131 formed in a seating surface 133 on which the IC is seated, and supporting the upper terminals 162 of the pogo contacts such that the upper terminals are vertically movable; a plurality of springs 132 elastically supported between the IC guide 130 and the contact guide 151; a cover 21 elastically biased to the socket body 141 via a plurality of cover springs 26, moving vertically from the socket body 141 to a maximum moving distance, and including a plurality of slot plates 24 each having a latch cam slot 25; a latch 29 pressing the IC, and including a fixed hole 28 used to fasten the latch to the socket body 141 using a latch moving shaft, and a movable hole 27 to move along an inclined surface of the latch cam slot of the cover; and a plurality of pogo contacts each having a contact body 160, a lower terminal 161, and an upper terminal 162 that are provided in a straight-line shape, and a spring provided in the contact.

Preferably, the latch cam slot includes a gentle slope 47 curved in an arc shape and having a gentle curvature, and a steep slope 48 having a steeper curvature than the gentle slope 47.

The present invention provides a test and burn-in socket for integrated circuits (ICs), including a socket body 241 having a plurality of holes 242 through which a plurality of lower terminals 261 of pogo contacts pass, the holes formed to prevent contact bodies 260 from being dislodged from predetermined positions, a plurality of positioning pins 49 to secure the socket body to a predetermined position on a printed circuit board (PCB), and a plurality of bolt insert holes 99 used to fasten the socket body to the PCB using bolts; a contact guide 251 having a plurality of holes 252 through which upper terminals 262 of the pogo contacts pass, the holes formed to prevent the contact bodies 260 from being dislodged from predetermined positions; an IC guide 130 provided above the contact guide 251 to guide an IC, and including a plurality of moving holes 131 formed in a seating surface 133 on which the IC is seated, and supporting the upper terminals 262 of the pogo contacts such that the upper terminals are vertically movable; a plurality of springs 132 elastically supported between the IC guide 130 and the contact guide 251; a cover 221 elastically biased toward the socket body 241 by a plurality of cover springs 26, moving vertically from the socket body 241 to a maximum moving distance S, and including a plurality of supports 222 each having a shaft hole 224, with a latch moving shalt 223 passing through the shaft hole; a latch 270 pressing the IC using an IC press part 272, and including a rotary hole 273 used to fasten the latch to the socket body 241 via a latch rotary shalt 274, a spring support hole 276, and a latch cam 271 moving while contacting the latch moving shaft 223, when the latch moving shaft mounted on the cover 221 moves vertically; a latch torsion spring 275 biased in a direction opening the latch; and a plurality of pogo contacts each having a contact body 260, a lower terminal 261, and an upper terminal 262 that are provided in a straight-line shape, and a spring provided in the contact.

Preferably, the latch cam 271 includes a gentle slope 277 having a gentle curvature, and a steep slope 278 having a steeper curvature than the gentle slope.

DESCRIPTION OF DRAWINGS

FIG. 1 is a plan view showing a BGA-type IC;
FIG. 2 is a side view showing the BGA-type IC;
FIG. 3 is a plan view showing an LGA-type IC;
FIG. 4 is a side view showing the LGA-type IC;
FIG. 5 is a plan view showing a conventional IC socket;

FIG. 6 is a vertical sectional view showing the conventional IC socket;

FIG. 7 is a plan view of a test and burn-in socket for ICs, according to the first embodiment of the present invention;

FIG. 8 is a vertical sectional view taken along line X1-X1 of FIG. 7;

FIG. 9 is a vertical sectional view taken along line X2-X2 of FIG. 7;

FIG. 10 is a front view of a contact, according to the first embodiment of this invention;

FIG. 11 is a side view of the contact, according to the first embodiment of this invention;

FIG. 12 is a view illustrating the method of assembling the contact, according to the first embodiment of this invention;

FIGS. 13 to 17 are vertical sectional views showing the operation of the test and burn-in socket for ICs, according to the first embodiment of this invention;

FIG. 18 is a plan view of a test and burn-in socket for ICs, according to the second embodiment of the present invention;

FIG. 19 is a vertical sectional view taken along line X3-X3 of FIG. 18;

FIG. 20 is a vertical sectional view taken along line X4-X4 of FIG. 18;

FIG. 21 is a front view of a contact, according to the second embodiment of this invention;

FIG. 22 is a side view of the contact, according to the second embodiment of this invention;

FIG. 23 is a view illustrating the method of assembling the contact, according to the second embodiment of this invention;

FIGS. 24 to 28 are vertical sectional views showing the operation of the test and burn-in socket for ICs, according to the second embodiment of this invention;

FIG. 29 is a plan view of a test and burn-in socket for ICs, according to the third embodiment of the present invention;

FIG. 30 is a vertical sectional view taken along line X5-X5 of FIG. 29;

FIGS. 31 to 33 are vertical sectional views showing the operation of the test and burn-in socket for ICs, according to the third embodiment of this invention;

FIG. 34 is a plan view of a test and burn-in socket for ICs, according to a modification of the present invention;

FIG. 35 is a vertical sectional view taken along line X7-X7 of FIG. 34; and FIGS. 36 to 38 are vertical sectional views showing the operation of the test and burn-in socket for ICs, according to the modification of this invention.

DESCRIPTION OF REFERENCE CHARACTERS OF IMPORTANT PARTS

1: BGA (Ball Grid Array)-type IC 2: soldering ball
3: LGA (Land Grid Array)-type IC 4: land
12,21: cover 13: lever
24: slot plate 25: latch cam slot
26: cover spring 29: latch
31, 90, 151: contact guide 37, 67, 141: body
61, 74: upper contact terminal of contact
63, 75: lower contact terminal of contact
47: gentle slope 48: steep slope

BEST MODE FOR CARRYING OUT THE INVENTION

Hereinafter, the present invention will be described in detail with reference to the accompanying drawings.

Reference now should be made to the drawings, in which the same reference numerals are used throughout the different drawings to designate the same components. For clarity of description of the present invention, the detailed description of known functions and constructions will be omitted.

A test and burn-in socket for ICs, according to the first embodiment of the present invention, will be described with reference to FIGS. 7 to 17. FIG. 7 is a plan view of a test and burn-in socket for ICs, according to the first embodiment of the present invention, FIG. 8 is a vertical sectional view taken along line X1-X1 of FIG. 7, FIG. 9 is a vertical sectional view taken along line X2-X2 of FIG. 7, FIG. 10 is a front view of a contact, according to the first embodiment of this invention, FIG. 11 is a side view of the contact, according to the first embodiment of this invention, and FIG. 12 is a view illustrating the method of assembling the contact, according to the first embodiment of this invention.

As shown in FIGS. 7 to 9, a body 37 of the test and burn-in socket for ICs, according to the first embodiment of the present invention, includes a plurality of contact support holes 42 and a plurality of positioning pins 49. The contact support holes 42 receive and support a plurality of contacts 33 therein. The positioning pins 49 secure the socket body to a predetermined position on a PCB. In this case, the socket body 37 serves as a base for assembling a slide 35, a latch 29, a contact guide 31, and a cover 21.

A lead guide 36 is provided under the socket body 37. Lead guide holes 40 are positioned at ends of lower contact terminals 63 of the contacts, via the lead guide 36.

The lead guide 36 functions to maintain the lower contact terminals 63 in a straight line without bending the lower contact terminals 63. Further, when the socket is assembled with the PCB, the lead guide 36 functions to precisely insert the lower contact terminals 63 into through holes of the PCB. When the socket is inserted into the PCB, the lead guide is introduced into the lower surface of the body 37.

The slide 35 is mounted to the socket body 37. In FIG. 8, which is a vertical sectional view taken along line X1-X1 of FIG. 7, the slide 35 is movable in a horizontal direction within a predetermined range. Further, the slide 35 is provided with a plurality of contact parts 34. The contact parts 34 contact slide cams 22 to allow the smooth sliding motion of the slide 35 when a plurality of contact through holes 44 through which upper contact terminals 61 of the contacts pass and the slide cams 22 of the cover 21 move up and down.

Further, in order to allow the slide 35 to smoothly return to its original position when the slide cams 22 move upwards, a plurality of slide springs 39 is elastically supported between the slide 35 and the socket body 37.

The contact guide 31 is provided above the slide 35, and guides the positions of the upper contact terminals 61 of the contacts, in addition to supporting an IC guide 30. A plurality of terminal through holes 43 is formed in the contact guide 31 to arrange the upper contact terminals 61 of the contacts at predetermined positions. In this case, the IC guide 30 functions to position each land of the IC and each upper contact terminal 61 on the same line in a vertical direction, and guide the position of the IC. The slide 35 functions to push an elastic part 62 of each contact 33 rightwards, thus elastically deforming the contact in the arc shape.

In this embodiment, it is apparent that the IC guide 30 may be changed according to the size of the IC loaded in the socket.

The cover 21 is constructed to move up and down relative to the body 37 by reference character S (maximum moving distance), with a plurality of cover springs 26 elastically supported between the cover 21 and the socket body 37.

Further, the cover 21 is provided with a plurality of slide cams 22 to move the slide 35 to the right of FIG. 8 which is a vertical sectional view taken along line X1-X1 of FIG. 7, when the cover 21 moves downwards. Further, a plurality of slot plates 24 each having a latch cam slot 25 is provided on the cover 21, so that the latch 29 is operated through each slot plate 24.

In this case, the latch cam slot 25 is curved in an arc shape, and includes a gentle slope 47 which has a gentle curvature and a steep slope 48 having a steeper curvature, in comparison with the gentle slope 47.

A plurality of latches 29 is provided on the socket. A fixed hole 8, formed in each latch 29, is fixed to the socket body 37 using a shaft (hereinafter, referred to as a "latch moving shaft"), which is parallel to the line X2-X2 of FIG. 7. Preferably, the latch moving shaft serves as a rotating center of each latch 29. According to this embodiment, the latch 29 comprises two or four latches provided on the socket. However, the present invention is not limited to this embodiment.

Like the fixed hole 28, a movable hole 27 is secured to the socket body using a moving shaft which is parallel to line X2-X2. The moving shaft moves along an inclined surface formed inside each latch cam slot 25. At this time, when the cover 21 is pressed, the cover springs 26 are pressed, and simultaneously the latches 29 are opened. Meanwhile, when the cover 21 is restored to its original state by the elastic force of the cover springs 26, the latches 29 are closed. Particularly, the steep slope 48 of each latch cam slot 25 is at 10 degrees on a vertical axis, thus generating a latch rotating force which is 5 times as great as a force moving the cover 21 upwards. Thereby, the latch structure for strongly pressing the IC using an upward moving force of the cover 21 is achieved.

Meanwhile, as shown in FIGS. 10 and 11, each contact 33 includes the upper contact terminal 61, the elastic part 62, and the lower contact terminal 63, which are not curved but are provided in a straight-line shape, and a 'U'-shaped body fitting part 64.

Further, as shown in FIG. 12, each contact 33 is inserted into the contact support hole 42 and a lead through hole 41, both of which are formed in the socket body 37. Subsequently, the body fitting part 64 is force-fitted into an associated contact support hole 42 of the socket body 37, thus securing the contacts 33 such that upper and lower positions thereof are constant. According to this embodiment, each contact 33 comprises a gold-plated copper alloy so as to improve electrical characteristics, such as electric conductivity. However, the present invention is not limited to the gold-plated copper alloy.

Hereinafter, the operation of the test and burn-in socket for ICs, which is constructed as described above, according to the first embodiment of the present invention, will be described in detail with reference to FIGS. 13 to 17. FIGS. 13 to 17 represent the first to fifth steps of the operation. FIGS. 13 to 17 are vertical sectional views showing the operation of the test and burn-in socket for ICs, according to the first embodiment of this invention.

First, as shown in FIG. 13, in the first step showing the initial state of the socket, the cover 21 is located at the uppermost position while being elastically supported by the cover springs 26. The slide 35 is located at an initial position where the slide 35 is elastically pushed by the slide springs 39.

At this time, as shown in FIGS. 7 to 9, the lead through hole 41 of each contact 33, each contact support hole 44 of the slide 35, and each terminal through hole 43 of the contact guide 31 are aligned in a row in a vertical direction. The straight line-shaped contact 33 is vertically erected without any deformation, such as bending. Further, each latch 29 is located at the front end of the lower surface of the corresponding latch cam slot 25 of the cover 21 by the latch moving shaft. At this time, the latch 29 is closed.

Next, in the second step of FIG. 14, the cover 21 is pressed downwards (state S1) by about ½ of the maximum moving distance S, and each slide cam 22 moves the slide 35 rightwards. The left wall of each contact support hole 44 pushes an associated contact 33 rightwards, thus elastically deforming the contact 33 in the arc shape. Further, the upper contact terminals 61 move downwards to a height which is similar to the upper surface of the contact guide 31, in comparison with the initial position of the first step.

In the first step, the latch moving shaft is constructed so that the rotating distance of the latch moving shaft from the steep slope 48 of each latch cam slot 25 to the outer portion of the socket is very short. Thus, in the second step, each latch 29 is located at a position similar to the initial state of the first step.

Thereafter, in the third step of FIG. 15, the cover 21 is completely pressed downwards. That is, the cover 21 is moved downwards by the maximum moving distance S, in comparison with the initial state of the first step. While being changed from the second step to the third step, each slide cam 22 no longer pushes the slide 35, but simply moves downwards. At this time, the steep slope 47 of each latch cam slot 25 serves to push the latch moving shaft out of the socket, thus opening the latch 29.

When the socket is ready to load the IC through the third step, the IC drops from an upper position into the IC guide 30. At this time, the IC guide 30 positions the IC within a range where the lands of the IC correspond to the terminals (upper contact terminals, lower contact terminals) of the contacts.

Next, in the fourth step of FIG. 16, showing the state where the IC is loaded in the socket, the cover 21 returns to a position corresponding to ½ of the maximum moving distance S. At this time, while each latch moving shaft completely passes through the gentle slope 47 of the latch cam slot 25, an end 46 of each latch presses the IC downwards. In this case, the curved surface of each slide cam 22 continuously pushes the slide 35, so that each contact 33 maintains an elastically deformed state.

Thereafter, in the fifth step of FIG. 17, while the steep slope 48 of each latch cam slot 25 moves upwards, it pushes the latch moving shaft toward the lower portion of the socket, that is, in a direction of pressing the IC by the latch 29, with a strong force. Through such operations, the IC moves downwards by a very short distance, and the inclined surface 23 of each slide cam moves upwards. Thereby, a force pushing the slide 35 is eliminated.

Afterwards, the slide 35 moves leftwards by the slide springs 39, so that each contact 33 is intended to be restored to the straight-line shape of the first step. At this time, each latch 29 presses the IC from a position above the contacts 33, and the upper contact terminals 61 contact the lands of the IC while having a predetermined force. Thereafter, a contact state is maintained while a predetermined elastic energy is retained. Consequently, the lands of the IC are in electrical contact with the upper contact terminals 61 of the contacts, so that power and input signals supplied from the exterior through the lower contact terminals 63 are transmitted to the IC, thus performing various test operations.

According to the first embodiment of the present invention, the test and burn-in socket for ICs is a soldering-type socket.

Hereinbefore, the test and burn-in socket for ICs, according to the first embodiment of this invention, has been described. Hereinafter, a test and burn-in socket for ICs, according to the second embodiment of this invention, will be described with reference to FIGS. 18 to 23. FIG. 18 is a plan view of a test and burn-in socket for ICs, according to the second embodiment of the present invention, FIG. 19 is a vertical sectional view taken along line X3-X3 of FIG. 18, FIG. 20 is a vertical sectional view taken along line X4-X4 of FIG. 18, FIG. 21 is a front view of a contact, according to the second embodiment of this invention, FIG. 22 is a side view of the contact, according to the second embodiment of this invention, and FIG. 23 is a view illustrating the method of assembling the contact, according to the second embodiment of this invention.

As shown in FIGS. 18 to 20, the socket is provided with a plurality of bolt insert holes 99, so that it may be fastened to a PCB using bolts. A socket body 67 includes a plurality of holes 80 through which lower contact holes 75 of contacts pass, and a plurality of positioning pins 49 to secure the socket body to a predetermined position of the PCB. In this case, the socket body 67 serves as a base for assembling a slide 65, a latch 29, a contact guide 90, and a cover 21.

The slide 65 is mounted to the socket body 67. In FIG. 19, which is a vertical sectional view taken along line X3-X3 of FIG. 18, the slide 65 is movable in a horizontal direction within a predetermined range. Further, the slide 65 is provided with a plurality of lower stop holes 81 through which the lower contact terminals 75 of the contacts pass and a plurality of contact parts 64. The contact parts 64 allow the smooth sliding motion of the slide when slide cams 22 of the cover 21 move up and down.

Further, in order to allow the slide 65 to smoothly return to its original position when the slide cams 22 move upwards, a plurality of slide springs 39 is elastically supported between the slide 65 and the socket body 67.

The contact guide 90 is provided above the slide 65, and guides the positions of upper contact terminals 74 of the contacts, in addition to supporting an IC guide 30. A plurality of upper stop holes 91 is formed in the contact guide 90 to arrange the upper contact terminals 74 of the contacts at predetermined positions. In this case, the IC guide 30 functions to position each land of the IC and each upper contact terminal 74 on the same line in a vertical direction, and guide the position of the IC.

In this embodiment, it is apparent that the IC guide 30 may be changed according to the size of the IC loaded in the socket.

The cover 21 is constructed to move up and down relative to the body 67 by reference character S (maximum moving distance), with a plurality of cover springs 26 elastically supported between the cover 21 and the socket body 67. Further, the cover 21 is provided with a plurality of slide cams 22 to move the slide 65 to the right of FIG. 19 which is a vertical sectional view taken along line X3-X3 of FIG. 18, when the cover 21 moves downwards. At this time, the slide 65 pushes the middle portion of each contact 73 rightwards, so that the contact 73 is elastically deformed in an arc shape. Further, a plurality of slot plates 24 each having a latch cam slot 25 is provided on the cover 21, so that the latch 29 is operated through each slot plate 24.

In this case, the latch cam slot 25 is curved in an arc shape, and includes a gentle slope 47 which has a gentle curvature and a steep slope 48 having a steeper curvature, in comparison with the gentle slope 47.

A plurality of latches 29 is provided on the socket. Each latch 29 is secured to the socket body 67 by inserting a shaft (hereinafter, referred in as a "latch moving shaft"), which is parallel to the line X4-X4 of FIG. 18, into a fixed hole 28. Preferably, the latch moving shaft serves as a rotating center of each latch 29. According to this embodiment, the latch 29 comprises two or four latches provided on the socket. However, the present invention is not limited to this embodiment.

Like the fixed hole 28, a movable hole 27 is secured to the socket body using a moving shaft which is parallel to line X4-X4 of FIG. 18. The moving shaft moves along an inclined surface formed inside each latch cam slot 25 of the cover 21. At this time, when the cover 21 is pressed downwards, the cover springs 26 are pressed, and simultaneously the latches 29 are opened. Meanwhile, when the cover 21 is restored to its original state by the elastic force of the cover springs 26, the latches 29 are closed. Particularly, the steep slope 48 of each latch cam slot 25 is at 10 degrees on a vertical axis, thus generating a latch rotating force which is 5 times as great as a force moving the cover 21 upwards. Thereby, the latch structure for strongly pressing the IC using an upward moving force of the cover 21 is achieved.

Meanwhile, as shown in FIGS. 21 and 22, each contact 73 is not curved but is provided in a straight-line shape, and includes the upper contact terminal 74, the lower contact terminal 75, an upper stop protrusion 76, and a lower stop protrusion 77. In this case, the lower contact terminals 75 of the contacts are constructed to contact the terminals of the PCB with a predetermined contact force, in the same manner in which the upper contact terminals 74 are in contact with the lands of the IC loaded in the socket. According to this embodiment, each contact 73 comprises a gold-plated copper alloy so as to improve electrical characteristics, such as electric conductivity. However, the present invention is not limited to the gold-plated copper alloy.

As shown in FIG. 23, the contacts 73 are inserted into corresponding slide through holes 84, in the state where the socket body 67 is assembled with the slide 65. In this case, each slide through hole 84 has a flared shape so that each lower contact terminal 75 is easily inserted into the corresponding slide through hole 84.

Meanwhile, locking steps 83 are provided on the slide 65 so as to prevent the lower stop protrusions 77 of the contacts inserted through enlarged holes 82 from being undesirably dislodged from the slide 65. The locking steps 83 limit the length of the lower contact terminals 75 protruding from the bottom of the socket.

After the contacts 73 are inserted into the slide through holes 84 and the holes 80, the contacts 73 are arranged in a row. In such a state, the contact guide 90 is assembled with the upper portions of the contacts 73.

Contact through holes 94, enlarged holes 92, and locking steps 93 are formed in the contact guide 90 in the same vertical axis as the slide through holes 84 formed in the slide 65 and the holes 80 of the body. Thus, after the upper contact terminals 74 pass through the contact through holes 94 of the contact guide 90, the upper stop protrusions 76 are inserted into the enlarged holes 92 of the contact guide 90, and are simultaneously stopped by the locking steps 93. Thereby, the removal of the upper stop protrusions 76 is prevented.

Hereinafter, the operation of the test and burn-in socket for ICs, which is constructed as described above, according to the second embodiment of the present invention, will be described in detail with reference to FIGS. 24 to 28. FIGS. 13 to 17 represent the first to fifth steps of the operation. FIGS. 24 to 28 are vertical sectional views showing the operation of the test and burn-in socket for ICs, according to the second embodiment of this invention.

First, in the first step of FIG. 24 showing the initial state of the socket, the cover 21 is located at the uppermost position by the cover springs 26, and the slide 65 is located at the initial position which is pushed by the slide springs 39. At this time, the holes 80 of the socket body 67, the lower stop holes 81, and the upper stop holes 91 are vertically arranged in a row. The straight-line-shaped contacts 73 are vertically erected without any deformation such as bending. Further, each latch 29 is located at the front end of the lower surface of the latch cam slot 25 of the cover 21 via the latch moving shaft. At this time, the latch 29 is closed.

Next, in the second step of FIG. 25, the cover 21 is pressed downwards (state S1) by about ½ of the maximum moving distance S, and each slide cam 22 moves the slide 65 rightwards. The left wall of each upper stop hole 81 pushes an associated contact 73 rightwards, thus elastically deforming the contact 73 in the arc shape. Further, the upper contact terminals 74 move downwards to a height which is similar to the upper surface of the contact guide 90, in comparison with the initial position of the first step.

In the first step, the latch moving shaft is constructed so that the rotating distance of the latch moving shaft from the steep slope 48 of each latch cam slot 25 to the outer portion of the socket is very short. Thus, in the second step, each latch 29 is located at a position similar to the initial state of the first step.

Thereafter, in the third step of FIG. 26, the cover 21 is completely pressed downwards. That is, the cover 21 is moved downwards by the maximum moving distance 5, in comparison with the initial state of the first step. While being changed from the second step to the third step, each slide cam 22 no longer pushes the slide 35, but simply moves downwards. At this time, the steep slope 47 of each latch cam slot 25 serves to push the latch moving shaft out of the socket, thus opening the latch 29.

When the socket is ready to load the IC through the third step, the IC drops from an upper position into the IC guide 30. At this time, the IC guide 30 positions the IC within a range where the lands of the IC correspond to the terminals (upper contact terminals, lower contact terminals) of the contacts.

Next, in the fourth step of FIG. 27, showing the state where the IC is loaded in the socket, the cover 21 returns to a position corresponding to ½ of the maximum moving distance S. At this time, while each latch moving shaft completely passes through the gentle slope 47 of the latch cam slot 25, an end 46 of each latch presses the IC downwards. In this case, the curved surface of each slide cam 22 continuously pushes the slide 65, so that each contact 73 maintains an elastically deformed state.

Thereafter, in the fifth step of FIG. 28, while the steep slope 48 of each latch cam slot 25 moves upwards, it pushes the latch moving shaft toward the lower portion of the socket, that is, in a direction of pressing the IC by the latch 29, with a strong force. Through such operations, the IC moves downwards by a very short distance, and the inclined surface 23 of each slide cam moves upwards. Thereby, a force pushing the slide 65 is eliminated.

Afterwards, the slide 65 moves leftwards by the slide springs 39, so that each contact 73 is intended to be restored to the straight-line shape of the first step. At this time, each latch 29 presses the IC from a position above the contacts 73, and the upper contact terminals 74 contact the lands of the IC while having a predetermined force. Thereafter, a contact state is maintained while a predetermined elastic energy is retained.

Consequently, the lands of the IC are in electrical contact with the upper contact terminals 74 of the contacts, so that power and input signals supplied from the exterior through the lower contact terminals 75 are transmitted to the IC, thus performing various test operations.

According to the second embodiment of the present invention, the test and burn-in socket for ICs is a surface-mount-type socket.

Hereinbefore, the test and burn-in socket for ICs, according to the first embodiment of this invention, has been described.

Hereinafter, a test and burn-in socket for ICs, according to the second embodiment of this invention, will be described with reference to FIGS. 29 and 30. FIG. 29 is a plan view of a test and burn-in socket for ICs, according to the third embodiment of the present invention, and FIG. 30 is a vertical sectional view taken along line X5-X5 of FIG. 29.

As shown in FIGS. 29 and 30, the socket according to the third embodiment of the present invention is a socket using pogo contacts. Each pogo contact includes a contact body 160 accommodating a spring having a predetermined elastic force therein, a lower terminal 161, and an upper terminal 162. The lower terminal 161 and the upper terminal 162 are operated by the spring.

As shown in FIGS. 29 and 30, a socket body 141 is provided with a plurality of bolt insert holes 99 to be fastened to terminals formed on a PCB using bolts. A plurality of holes 142 and a plurality of positioning pins 49 are formed in the lower portion of the socket body 141. Lower terminals 161 of the pogo contacts pass through the holes 142. Further, the holes 142 are formed to prevent the contact bodies 160 from being dislodged from predetermined positions. The positioning pins 49 secure the socket body to a predetermined position on the PCB. Preferably, the socket body 141 serves as a base for assembling a latch 29, a contact guide 151, and a cover 21.

Further, the contact guide 151 is provided on the upper portion of the socket body 141 so that the upper terminals 162 of the pogo contacts movably pass through the contact guide 151. A plurality of holes 152 is formed in the contact guide 151 at regular intervals so as to prevent the contact bodies 160 from being dislodged from predetermined positions. In this case, the pogo contacts are assembled between the contact bodies 160 and the contact guide 151, as shown in FIG. 30.

An IC guide 130 is provided to guide the IC such that a land of the IC loaded in the socket is located along the same vertical axis as each pogo contact terminal (upper terminal, lower terminal). In this embodiment, it is apparent that the IC guide 130 may be changed according to the size of the IC loaded in the socket.

A seating surface 133 is provided on the upper portion of the contact guide 151. A plurality of moving holes 131 is formed in the sealing surface 133, and supports the upper terminals 162 such that the upper terminals 162 are vertically movable. Further, a plurality of springs 132 having a predetermined elastic force is elastically supported between the IC guide 130 and the contact guide 151.

In the initial state where the IC is not loaded, the seating surface 133 is positioned to be higher than ends of the upper terminals 162 of the pogo contacts. When the IC is loaded in the socket, an end 46 of each latch presses the IC, and the IC guide 130 moves downwards along with the loaded IC. At this time, the ends of the upper terminals 162 protrude through the moving holes 131, so that the seating surface 133 contacts the lands of the IC, and moves downwards by a pressed distance.

Further, the cover 21 is provided to move vertically relative to the socket body 141 by the maximum moving distance S. A plurality of cover springs 26 is elastically supported between the cover 21 and the socket body 141. Further, a plurality of slot plates 24 each having a latch cam slot 25 is provided on the cover 21, so that the latches 29 are operated through the slot plates.

In this case, the latch cam slot 25 includes a gentle slope 47 and a steep slope 28. The gentle slope 47 is curved in an arc shape and has a gentle curvature. The steep slope 28 has a steeper curvature than the gentle slope 47.

A plurality of latches 29 is provided on the socket. A fixed hole 28, formed in each latch, is fixed to the socket body 141 using a shaft (hereinafter, referred to as a "latch moving shaft"), which is parallel to the line X6-X6 of FIG. 29. Preferably, the latch moving shaft serves as a rotating center of each latch 29.

Further, a movable hole 27 is secured to the socket body using a moving shaft which is parallel to line X6-X6. The moving shaft moves along an inclined surface formed inside each latch cam slot 25 of the cover 21. At this time, when the cover 21 is pressed downwards, the latches 29 are opened. Meanwhile, when the cover 21 is restored to its original state by the elastic force of the cover springs 26, the latches 29 are closed. Particularly, the steep slope 48 of each latch cam slot 25 is at 10 degrees on a vertical axis, thus generating a latch rotating force which is 5 times as great as a force moving the cover 21 upwards. Thereby, the latch structure for strongly pressing the IC using an upward moving force of the cover 21 is achieved.

Hereinafter, the operation of the test and burn-in socket for ICs, which is constructed as described above, according to the third embodiment of the present invention, will be described in detail with reference to FIGS. 31 to 33. FIGS. 31 to 33 represent the first to third steps of the operation. FIGS. 31 to 33 are vertical sectional views showing the operation of the test and burn-in socket for ICs, according to the third embodiment of this invention.

First, as shown in FIG. 31, in the first step showing the initial state of the socket, the cover 21 is located at the uppermost position by the cover springs 26. Further, each latch 29 is located at the front end of the lower surface of the corresponding latch cam slot 25 of the cover by the latch moving shaft. At this time, each latch 29 is closed. Further, the IC guide 130 is elastically supported by the plurality of springs 132, thus being located at an initial position where the IC guide 130 is pushed upwards.

Next, in the second step of FIG. 32, the cover 21 is moved completely downwards by the maximum moving distance S, in comparison with the initial state of the first step. Each latch 29 is opened by the latch cam slot 25.

When the socket is ready to load the IC through the second step, the IC drops from an upper position into the IC guide 130. At this time, the IC guide 130 positions the IC within a range where the lands of the IC correspond to the terminals (upper terminals, lower terminals) of the contacts.

Next, in the third step of FIG. 33, showing the state where the IC is loaded in the socket, an end 46 of each latch presses the IC downwards while each latch moving shaft completely passes through the gentle slope 47 of the latch cam slot 25. At this time, while the steep slope 48 of each latch cam slot 25 moves upwards, it pushes the latch moving shaft toward the lower portion of the socket, that is, in a direction of pressing the IC by the latch 29, with a strong force. The cover 21 returns to its original position, just like in the first step. Further, the IC and the IC guide 130 move downwards together, and the upper terminals 162 of the pogo contacts contact the lands of the IC. Afterwards, the upper terminals 162 move downwards until the IC guide 130 reaches the upper surface of the contact guide 151. The upper terminals 162 contact the lands of the IC with a predetermined force.

As a result, through the operation of the third step, the lands of the IC are in electrical contact with the terminals (upper terminals, lower terminals) of the contacts. Through the terminals of the contacts, power and signals are transmitted to the IC, so that it is possible to execute various test operations.

It is obvious that various types of contacts, such as a spring contact or a pogo contact, may be applied to the test and burn-in socket for ICs according to the third embodiment of this invention.

Hereinbefore, the test and burn-in socket for ICs, according to the third embodiment of this invention, has been described. Hereinafter, a test and burn-in socket for ICs, according to a modification of this invention, will be described with reference to FIGS. 34 and 35. FIG. 34 is a plan view of a test and burn-in socket for ICs, according to a modification of the present invention, and FIG. 35 is a vertical sectional view taken along line X7-X7 of FIG. 34.

As shown in FIGS. 34 and 35, the modification of the present invention uses a pogo contact which is very short in length. The pogo contact includes a contact body 260 accommodating a spring having a predetermined elastic force, a lower terminal 261, and an upper terminal 262. The lower terminal 261 and the upper terminal 262 are operated by a spring.

As shown in FIGS. 34 and 35, a socket body 241 is provided with a plurality of bolt insert holes 99 to be fastened to terminals formed on a PCB using bolts. A plurality of holes 242 and a plurality of positioning pins 49 are formed in the lower portion of the socket body 241. Lower terminals 261 of the pogo contacts pass through the holes 242. Further, the holes 242 are formed to prevent the contact bodies 260 from being dislodged from predetermined positions. The positioning pins 49 secure the socket body to a predetermined position on the PCB. Preferably, the socket body 241 serves as a base for assembling a latch 270, a contact guide 251, and a cover 221.

Further, the contact guide 251 is provided on the upper portion of the socket body 241 so that the upper terminals 262 of the pogo contacts movably pass through the contact guide 251. A plurality of holes 252 is formed in the contact guide 251 at regular intervals so as to prevent the contact bodies 260 from being dislodged from predetermined positions. In this case, the pogo contacts are assembled between the socket body 241 and the contact guide 151, as shown in FIG. 35.

An IC guide 130 is provided to guide the IC such that a land of the IC loaded in the socket is located along the same vertical axis as each pogo contact terminal (upper terminal). In this embodiment, it is apparent that the IC guide 130 may be changed according to the size of the IC loaded in the socket.

A seating surface 133 is provided on the upper portion of the contact guide 251, so that the IC is seated on the seating surface. A plurality of moving holes 131 is formed in the seating surface 133, and supports the upper terminals 262 such that the upper terminals 262 are vertically movable.

Further, a plurality of springs 132 having a predetermined elastic force is elastically supported between the IC guide 130 and the contact guide 251. In the initial state where the IC is not loaded, the seating surface 133 is positioned to be higher than ends of the upper terminals 262 of the pogo contacts. When the IC is loaded in the socket, a press part 272 of each latch shown in FIG. 35 presses the IC, and the IC guide 130 moves downwards along with the loaded IC. At this time, the ends of the upper terminals 262 protrude through the moving holes 131, so that the seating surface 133 contacts the lands of the IC, and moves downwards by a pressed distance.

Further, the cover 221 is provided to move vertically relative to the socket body 241 by the maximum moving distance S. A plurality of cover springs 26 is elastically supported between the cover 221 and the socket body 241.

A shaft hole 224 is formed in the cover 221, so that each latch moving shaft 223 assembled with a plurality of supports 222 passes through the shaft hole 224. Each latch is operated via the latch moving shaft 223. In this case, the shaft assembled with the cover comprises two or four shafts, so that it is possible to form two or four latches.

Each latch 270 is rotatably fastened via a latch rotary shaft 274 having a rotary hole 273. The latch 270 includes the press part 272 which presses the IC, and a latch cam 271 which movably contacts each latch moving shaft 223 fastened to the cover 221. Each latch 270 is normally biased in an open direction by a latch torsion spring 275 elastically supported between the socket body 241 and the latch. Thus, one end of the latch torsion spring 275 is fastened to a spring support hole 243 which is formed in the socket body, while the other end of the latch torsion spring 275 is fastened to a spring support hole 276 which is formed in each latch.

The latch cam 271 includes a gentle slope 277 and a steep slope 278 having a steeper curvature than the gentle slope 277. In the case where the IC is loaded in the socket and then the cover 221 returns to its original position, the IC press part 273 of each latch presses the IC downwards while the latch moving shaft 223 of the cover passing through the steep slope 278 of the latch, thus pressing the IC guide 130 and the upper terminals 262 of the contacts. Thereby, the IC is electrically connected to the upper terminals of the pogo contact. Particularly, since the steep slope 278 is at 10 degrees to the latch moving shaft 223, a latch rotating force which is 5 times as large as a force of moving the cover upwards is generated. When the distance from the rotating shaft 274 to the latch moving shaft 223 when the cover 221 is at the original position is twice as large as a horizontal distance from the latch rotary shaft 274 to the IC press part 272, the IC is pressed with a force which is about ten limes as large as the upward moving force of the cover.

Hereinafter, the operation of the test and burn-in socket for ICs, which is constructed as described above, according to the modification of the present invention, will be described in detail with reference to FIGS. 36 to 38. FIGS. 36 to 38 represent the first to third steps of the operation. FIGS. 36 to 38 are vertical sectional views showing the operation of the test and burn-in socket for ICs, according to the modification of this invention.

First, as shown in FIG. 36, in the first step showing the initial state of the socket, the cover 221 is located at the uppermost position by the cover springs 26. Thus, the latch moving shaft 223 is positioned at the front end of the steep slope 278 of each latch 270. At this lime, each latch 29 is closed. Further, the IC guide 130 is elastically supported by the plurality of springs 132, thus being located at an initial position where the IC guide 130 is pushed upwards.

Next, in the second step of FIG. 37, the cover 221 is moved completely downwards by the maximum moving distance S, in comparison with the initial state of the first step. Each latch 270 is opened by the latch torsion spring 275.

When the socket is ready to load the IC through the second step, the IC drops from an upper position into the IC guide 130. At this time, the IC guide 130 positions the IC within a range where the lands of the IC correspond to the terminals (upper terminals) of the contacts.

Next, in the third step of FIG. 38, showing the state where the IC is loaded in the socket, an end 773 of each latch presses the IC downwards with a strong force while each latch moving shaft passes through the steep slope 278 of the latch. The cover 21 returns to its original position, just like in the first step. Further, the IC and the IC guide 130 move downwards together, and the upper terminals 262 of the pogo contacts contact the lands of the IC. Afterwards, the upper terminals 262 move downwards until the IC guide 130 reaches the upper surface of the contact guide 251. The upper terminals 262 contact the lands of the IC with a predetermined force.

As a result, through the operation of the third step, the lands of the IC are in electrical contact with the terminals (upper terminals, lower terminals) of the contacts. Through the terminals of the contacts, power and signals are transmitted to the IC, so that it is possible to execute various test operations.

It is obvious that various types of contacts, such as a spring contact or a pogo contact, may be applied to the test and burn-in socket for ICs according to the modification of this invention.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

According to the present invention, a straight-line-shaped contact is provided on a soldering-type socket for LGA, a surface-mount-type socket for LGA, or a socket for LGA which is a surface-mount-type socket and uses a pogo contact, a spring contact, etc., so that a slide and a latch are operated by a slide cam and a latch cam slot formed in a cover, the contact is elastically deformed by the moving operation of the slide, the latch presses an IC downwards relative to the socket after the IC is loaded in the socket, and thereafter, an elastic force applied to the contact is eliminated, so that the contact contacts the IC by a restoring force of the contact, thus simplifying the construction of the socket in comparison with a conventional socket and reducing costs of the product, in addition to enhancing reliability.

Further, the present invention provides a socket for mainly testing an LGA type IC. However, the present invention may be variously applied to a BGA-type IC or other types of ICs. Moreover, this invention may be applied to a socket for loading new types of ICs which may be invented in the future.

The invention claimed is:

1. A test and burn-in socket for integrated circuits (ICs), comprising:
    a socket body, comprising:
        a plurality of contact support holes to receive and support a plurality of contacts therein; and
        a plurality of positioning pins to secure the socket body to a predetermined position on a printed circuit board (PCB);
    a lead guide provided under the socket body, and having a plurality of lead guide holes;
    a slide mounted to the socket body to move horizontally within a predetermined range, and comprising:
    a plurality of contact parts contacting slide cams to allow smooth sliding motion of the slide; and
    a plurality of contact through holes through which upper contact terminals of the contacts pass;
    a plurality of slide springs elastically supported between the slide and the socket body, thus allowing the slide to smoothly restore an original position thereof;
    a contact guide provided above the slide, having a plurality of terminal through holes to arrange the upper contact terminals of the contacts at predetermined positions, and guiding positions of the upper contact terminals of the contacts;
    an IC guide provided above the contact guide to guide a position of an IC;
    a cover moving vertically from the socket body to a maximum moving distance, and comprising:
    a plurality of cover springs elastically supported between the cover and the socket body; and
    a plurality of slot plates each having a latch cam slot;

a latch pressing the IC, and comprising:
a fixed hole to fax the latch to the socket body using a latch moving shaft; and
a movable hole to move along an inclined surface of the latch cam slot; and
the plurality of contacts each comprising:
the upper contact terminal, an elastic part, and a lower contact terminal that are provided in a straight-line shape; and
an U-shaped body fitting part.

2. The test and burn-in socket as set forth in claim 1, wherein, when the cover moves downwards, the slide is moved rightwards by inclined surfaces of the slide cams, and the elastic parts of the contacts fitted into the contact through holes are elastically deformed in an arc shape.

3. The test and burn-in socket as set forth in claim 1, wherein the latch cam slot comprises:
a gentle slope curved in an arc shape and having a gentle curvature; and
a steep slope having a steeper curvature, in comparison with the gentle slope.

* * * * *